(12) United States Patent
Jerdev et al.

(10) Patent No.: US 7,598,132 B2
(45) Date of Patent: Oct. 6, 2009

(54) ACTIVE PHOTOSENSITIVE STRUCTURE WITH BURIED DEPLETION LAYER

(75) Inventors: Dmitri Jerdev, South Pasadena, CA (US); Nail Khaliullin, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 236 days.

(21) Appl. No.: 11/649,777

(22) Filed: Jan. 5, 2007

(65) Prior Publication Data
US 2007/0114584 A1 May 24, 2007

Related U.S. Application Data

(62) Division of application No. 10/928,314, filed on Aug. 30, 2004, now Pat. No. 7,442,970.

(51) Int. Cl.
*H01L 21/337* (2006.01)

(52) U.S. Cl. ............... 438/186; 438/48; 438/81; 257/E21.394

(58) Field of Classification Search ............ 438/48, 438/81, 186, 194; 257/461, 462, E21.148, 257/E21.394
See application file for complete search history.

(56) References Cited

U.S. PATENT DOCUMENTS

| 3,887,936 | A | | 6/1975 | Shannon et al. | |
|---|---|---|---|---|---|
| 5,298,778 | A | * | 3/1994 | Yonemoto | 257/257 |
| 5,528,059 | A | * | 6/1996 | Isogai | 257/187 |
| 6,188,093 | B1 | * | 2/2001 | Isogai et al. | 257/230 |
| 6,534,335 | B1 | * | 3/2003 | Rhodes et al. | 438/60 |
| 7,186,595 | B2 | * | 3/2007 | Kamashita et al. | 438/144 |
| 2001/0013900 | A1 | * | 8/2001 | Suzuki et al. | 348/302 |
| 2003/0089930 | A1 | | 5/2003 | Zhao | |
| 2003/0179159 | A1 | * | 9/2003 | Ohsawa et al. | 345/55 |

* cited by examiner

*Primary Examiner*—Tuan N. Quach
(74) *Attorney, Agent, or Firm*—Dickstein Shapiro LLP

(57) ABSTRACT

An imager pixel has a photosensitive JFET structure having a channel region located above a buried charge accumulation region. The channel region has a resistance characteristic that changes depending on the level of accumulated charge in the accumulation region. During an integration period, incident light causes electrons to be accumulated inside the buried accumulation region. The resistance characteristic of the channel region changes in response to a field created by the charges accumulated in the accumulation region. Thus, when a voltage is applied to one side of the channel, the current read out from the other side is characteristic of the amount of stored charges.

22 Claims, 7 Drawing Sheets

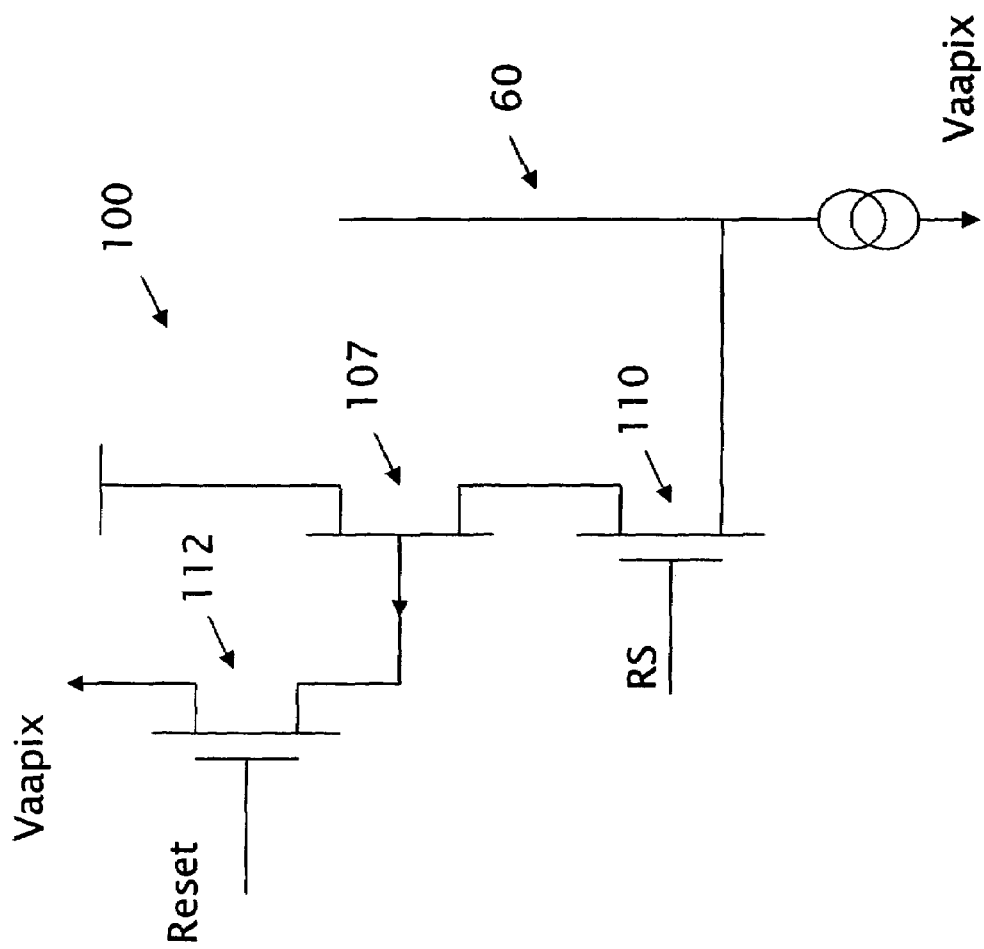

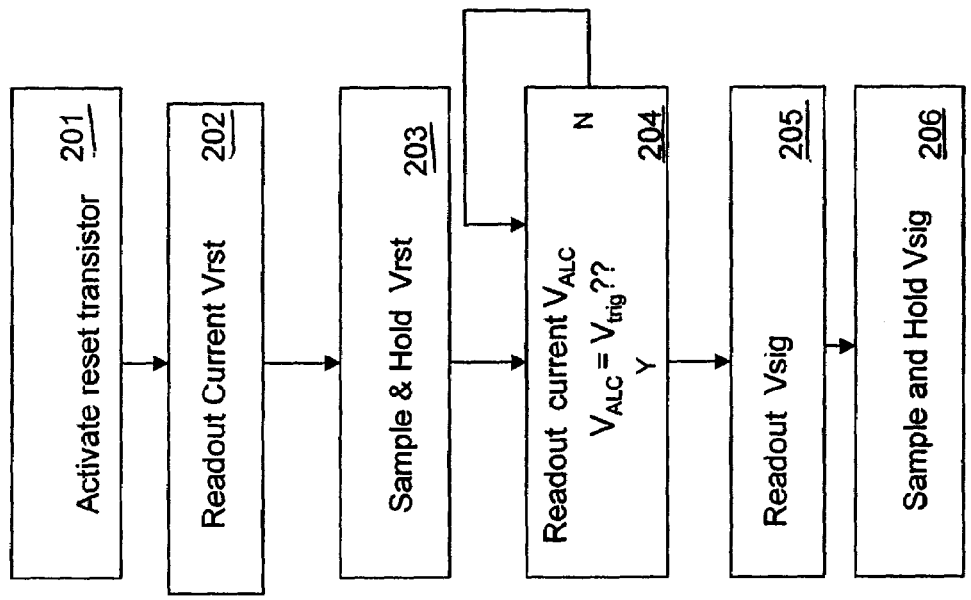

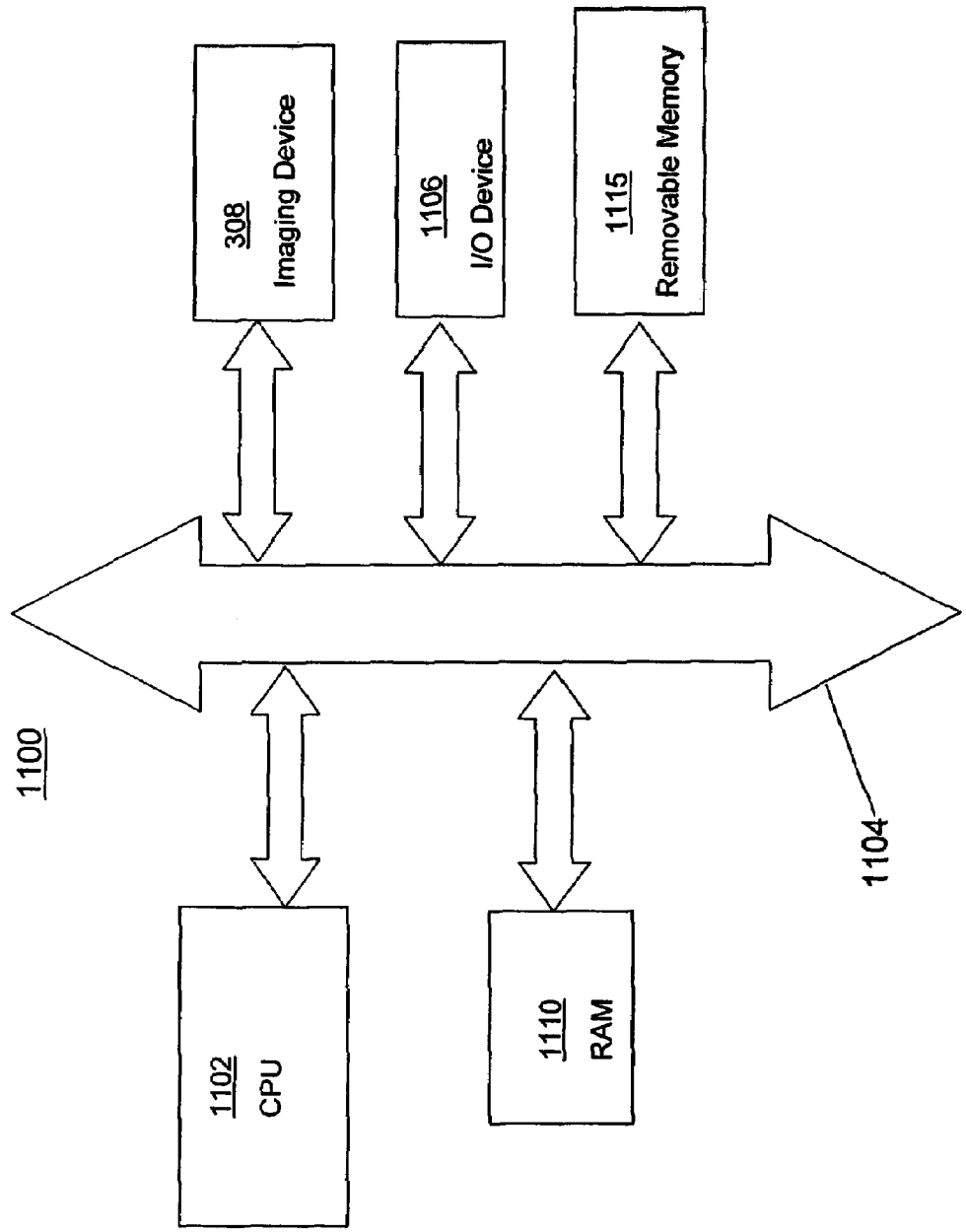

ACTIVE PHOTOSENSITIVE STRUCTURE WITH BURIED DEPLETION LAYER

The present application is a divisional of application Ser. No. 10/928,314, filed Aug. 30, 2004, now U.S. Pat. No. 7,442,970 the entire disclosure of which is incorporated herein by reference.

FIELD OF THE INVENTION

The present invention relates to the field of semiconductor devices and, in particular, to an active pixel photosensitive structure.

BACKGROUND OF THE INVENTION

A CMOS imager includes a focal plane array of pixel cells, each cell includes a photosensor, for example, a photogate, photoconductor or a photodiode overlying a substrate for producing a photo-generated charge in a doped region of the substrate. Typical CMOS imager pixel cells have either a three transistor (3T) or four transistor (4T) design. The 4T design is preferred over the 3T because it reduces the number of "hot" pixels in an array (those that experience increased dark current), and it diminishes the kTC noise that 3T designs may experience with the readout signals.

In a CMOS imager, the active elements of a pixel cell, for example a four transistor pixel, perform the necessary functions of (1) photon to charge conversion; (2) transfer of charge to a floating diffusion region; (3) resetting the floating diffusion region to a known state before the transfer of charge to it; (4) selection of a pixel cell for readout; and (5) output and amplification of signals representing a reset voltage and a pixel signal voltage, the latter based on the photo converted charges. The charge at the floating diffusion region is converted to a pixel output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; and U.S. Pat. No. 6,333,205, all assigned to Micron Technology Inc. The disclosures of each of the foregoing are hereby incorporated by reference herein in their entirety.

A conventional CMOS APS (active pixel sensor) four-transistor (4T) pixel cell 10 is illustrated in FIGS. 1A and 1B. FIG. 1A is a top-down view of the cell 10; FIG. 1B is a cross-sectional view of the cell 10 of FIG. 1A, taken along line A-A'. The illustrated cell 10 includes a pinned photodiode 13 as a photosensor. Alternatively, the CMOS cell 10 may include a photogate, photoconductor or other photon-to-charge converting device, in lieu of the pinned photodiode 13, as the initial accumulating area for photo-generated charge. The photodiode 13 includes a p+ surface accumulation region 5 and an underlying n-type accumulation region 14 formed in a p-type semiconductor substrate layer 2.

The pixel cell 10 of FIGS. 1A and 1B has a transfer gate 7 for transferring photocharges generated in the n-type accumulation region 14 to a floating diffusion region 3 (i.e., storage region). The floating diffusion region 3 is further connected to a gate 27 of a source follower transistor. The source follower transistor provides an output signal to a row select access transistor having a gate 37 for selectively gating the output signal to an output terminal (not shown). A reset transistor having a gate 17 resets the floating diffusion region 3 to a specified charge level before each charge transfer from the n-type accumulation region 14 of the photodiode 13.

The illustrated pinned photodiode 13 is formed in the p-type substrate 2. It is also possible, for example, to have a p-type substrate base beneath p-wells in an n-type epitaxial layer. The n-type accumulation region 14 and p+ surface accumulation region 5 of the photodiode 13 are spaced between an isolation region 9 and the transfer gate 7. The illustrated conventional pinned photodiode 13 has a p+/n-/p- structure.

The photodiode 13 has two p-type regions 5, 2 having the same potential so that the n- accumulation region 14 is fully depleted at a pinning voltage ($V_{pin}$). The photodiode 13 is termed "pinned" because the potential in the photodiode 13 is pinned to a constant value, $V_{pin}$, when the photodiode 13 is fully depleted. When the transfer gate 7 is conductive, photo-generated charge is transferred from the n- accumulating region 14 to the floating diffusion region 3.

Additionally, impurity doped source/drain regions 32, having n-type conductivity, are provided on either side of the transistor gates 17, 27, 37 to produce the reset, source follower, and row select transistors, respectively. Conventional processing methods are used to form contacts 33 in an insulating layer to provide an electrical connection 33 to the source/drain regions 32, the floating diffusion region 3, and other wiring to connect to the transistor gates 17, 27, and 37 and to form other connections in the cell 10.

Conventional 4T pixel cells, like the one depicted in FIGS. 1A and 1B, have the advantage over 3T pixel cells of having lower fixed pattern noise. The 4T pixel cells, however, have several drawbacks, which are now discussed generally. First, during the transfer of charges from the photodiode 13 to the floating diffusion region 3, some charges are left behind on the photodiode 13. This incomplete transfer creates lag, and can also lead to saturation of the photodiode 13 due to the presence of excess charge. The traditional 4 T design also reduces the fill factor of the cell 10 because the four transistors utilize space that could otherwise be used for a larger photo-sensitive area. As shown in FIG. 1A, the conventional pixel cell 10 has approximately a fifty percent fill factor, as only about half of the cell 10 (i.e., photodiode 13) makes up the photo-sensing area.

There is needed, therefore, a pixel cell having low fixed pattern noise but with a high fill factor, and reduced lag associated with the transferring of photo-charges. There is also a need for a simple method of fabricating the desired cell.

BRIEF SUMMARY OF THE INVENTION

Exemplary embodiments of the invention provide an imager pixel cell with a photosensitive JFET structure having a channel region located above a buried charge accumulation region. The channel region has a charge flow characteristic that changes depending on the level of accumulated charge in the accumulation region. During an integration period, incident light causes electrons to be accumulated inside the buried accumulation region. The charge flow characteristic of the channel region changes in response to a field created by the charges accumulated in the accumulation region.

In accordance with one aspect of the invention, the pixel cell can perform a charge accumulation mode simultaneously with performing a readout of the pixel, allowing for automatic light control operations.

BRIEF DESCRIPTION OF THE DRAWINGS

The foregoing and other aspects of the invention will be better understood from the following detailed description of the invention, which is provided in connection with the accompanying drawings, in which:

FIG. 2A is a schematic of a circuit diagram of an exemplary pixel cell constructed in accordance with a first exemplary embodiment of the invention;

FIG. 3 is a flowchart depicting the operation of a pixel cell according to an exemplary embodiment of the invention;

FIG. 5 shows a processor system incorporating at least one imager device constructed in accordance with an embodiment of the invention.

DETAILED DESCRIPTION OF THE INVENTION

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Figure 4:
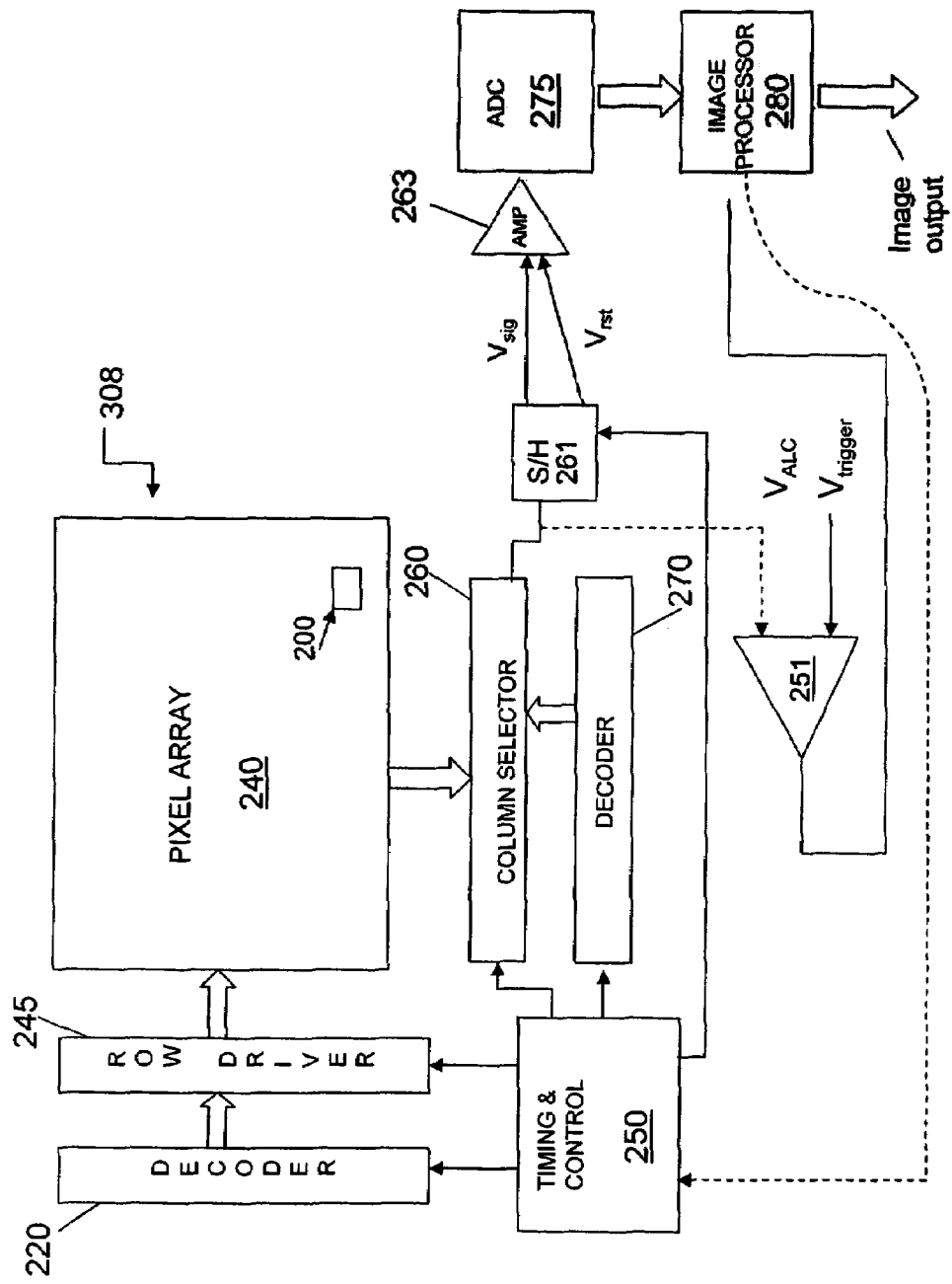
FIG. 4 is a block diagram of an imaging device constructed according to the invention.

Although the invention is described herein with reference to the architecture and fabrication of one pixel cell, it should be understood that this is representative of a plurality of pixel cells in an array of an imager device such as array 240 of imager device 308 (FIG. 4). In addition, the invention has applicability to many solid state imaging devices having pixel cells, and is not limited to the configuration described herein. The following detailed description is, therefore, not to be taken in a limiting sense, and the scope of the invention is defined only by the appended claims.

Referring now to the drawings, where like elements are designated by like reference numerals, FIG. 2A illustrates in electrical schematic form a pixel cell 100 in accordance with one embodiment of the invention. As shown, pixel cell 100 includes a light sensitive JFET 107 connected in source follower fashion through a row select transistor 110. The gate structure of the JFET is light sensitive and serves as a charge collection region for the pixel 100. The gate structure can be reset by a reset transistor 112 which receives a reset control signal (Reset). The row select transistor 110 is responsive to a row select signal (RS) at its gate input to thereby couple the pixel 100 to a column line 60 for readout of signals from the pixel 100.

Figure 2B:
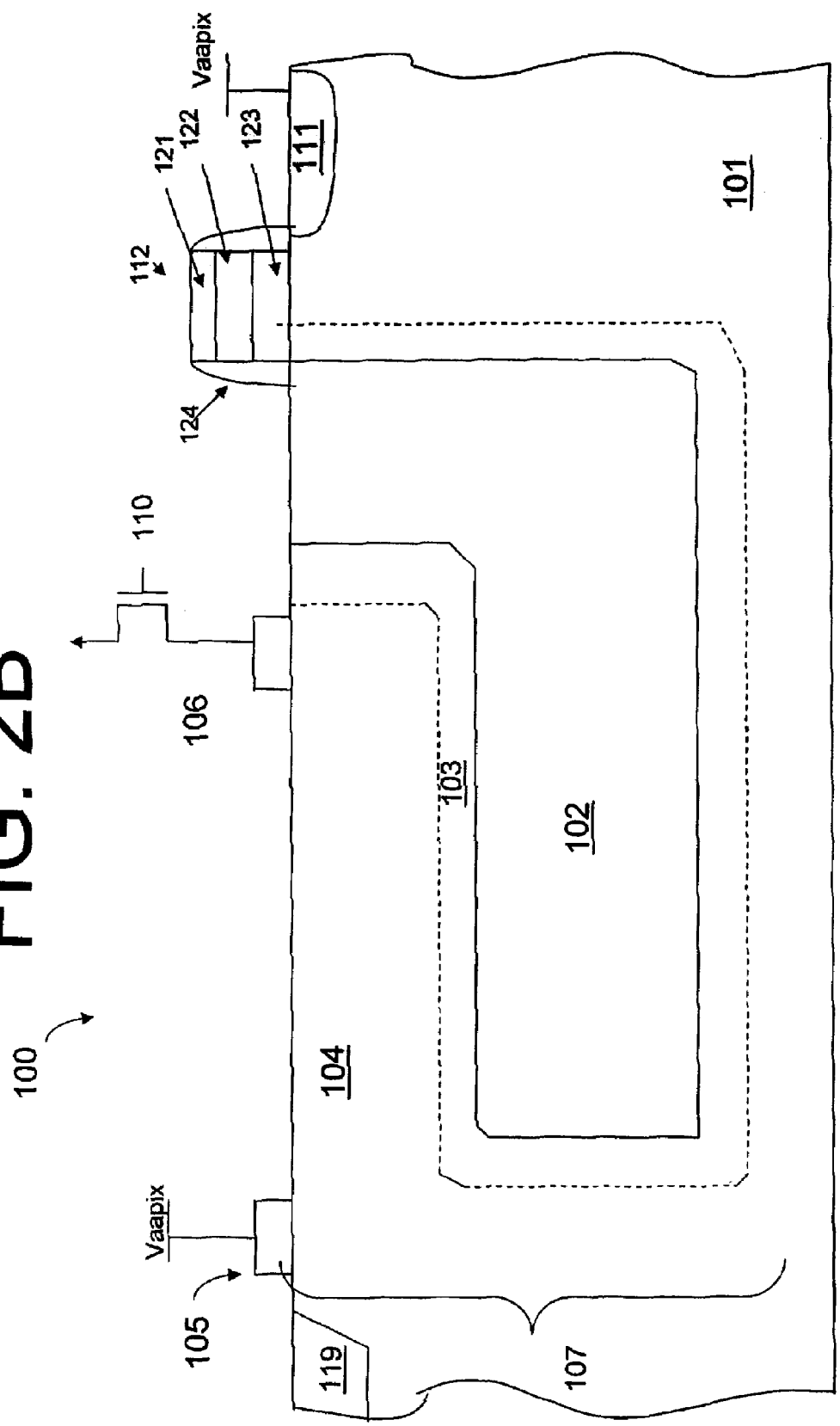
FIG. 2B is a cross-sectional view of the exemplary pixel cell of FIG. 2A constructed in accordance with a first exemplary embodiment of the invention.

FIG. 2B illustrates a cross-sectional view of a pixel cell 100 fabricated in accordance with a first exemplary embodiment of the invention. The pixel cell 100 is formed on a p-type semiconductor substrate 101. A photosensitive JFET structure 107 is comprised of regions 102, 104 formed in the substrate 101 and terminal contacts 105, 106. The first region is a doped n-type charge accumulation region 102. The thickness of the depletion region 103 decreases as charges accumulate in the charge accumulation region 102, as will be described in more detail below. A doped p-type channel region 104 is formed in the area of the substrate 101 above the accumulation region 102 and under a top surface of the substrate 101.

Two terminal contacts 105, 106 are formed on the surface of the substrate 101 on opposite sides of channel region 104. The terminal contacts 105, 106 may be formed of a layer of polysilicon or a suitable metal contact layer. The first terminal contact 105 is formed over and at one side of the channel region 104. The second terminal contact 106 is located at a second side (e.g., at the outermost edge) of the channel region 104. The first terminal contact is connected to a voltage source, shown as $V_{gnd}$. The bulk of the substrate, which is usually grounded, may be used as a terminal 105 for most implementations. The second terminal contact 106 is electrically connected to a row select transistor 110. The row select transistor 110 is utilized to selectively connect the pixel 100 to readout circuitry during readout of signals from the pixel cell 100.

The illustrated pixel cell 100 has a reset transistor 112 and an associated reset drain 111. The reset transistor 112 comprises a gatestack that may be formed using conventional techniques. For example, the illustrated gatestack has an insulative layer 121 over a conductive layer 122, which is formed over a gate oxide layer 123 on the surface of the substrate 101. The illustrated gatestack also has insulative sidewalls 124, which may be formed of an oxide, nitride, or other appropriate dielectric material as known in the art. Reset gate 112 when operative, couples the charge accumulation region 102, which acts as the gate of JFET 107, to a power supply $V_{aa\text{-}pix}$ to drain charges from region 102. The exemplary pixel cell 100 also has an STI region 119, which provides isolation from adjacent pixel cells when the pixel cell 100 is incorporated into a pixel array 240 (FIG. 5). It should be understood that pixel cell 100 may have additional isolation regions and that other methods of isolation are also within the scope of the invention. The described reset technique is provided as exemplary, and other embodiments of the invention may utilize different reset approaches.

The substrate 101 may be doped utilizing an implant of boron ions into the substrate 101. Although the invention is not in any way limited to a particular dopant concentration, the concentration of dopant ions in the substrate 101 may be in the range of about $1e^{15}$ atoms per cm$^3$ to about $1e^{20}$ atoms per cm$^3$. The accumulation region 102 is doped n- type by implanting a suitable dopant ion into a pre-determined area of the substrate 101. Suitable ions include antimony, arsenic, and phosphorus. The concentration of dopant ions in the charge accumulation region 102 may be in the range of about $1e^{15}$ atoms per cm$^3$ to about $1e^{20}$ atoms per cm$^3$. The channel region 104 should be lightly doped p- type. This channel region 104 is lightly doped with boron ions to a concentration that may be in the range of about $1e^{12}$ atoms per $cm^3$ to about $1e^{15}$ atoms per $cm^3$. The drain region 111 should also be lightly doped n-type.

The exemplary pixel cell 100 operates in a charge accumulation mode during an integration period. During charge accumulation, incident light is absorbed into the substrate 101. Electron-hole pairs are generated in the substrate 101 particularly at the junction of oppositely doped regions (i.e., in the vicinity of the p-n junctions). Electrons are stored in the charge accumulation region 102, while holes are repelled into the p-type regions such as the channel region 104. These electrons reduce the field existing in the depletion region (due to built-in volume charge) that reduces the depletion region 103 thickness and increases the thickness of the channel region 104. As a result, a charge flow conductance of the channel region 104 is characteristic of the amount of charges accumulated in the buried accumulation region 102.

Figure 1A:
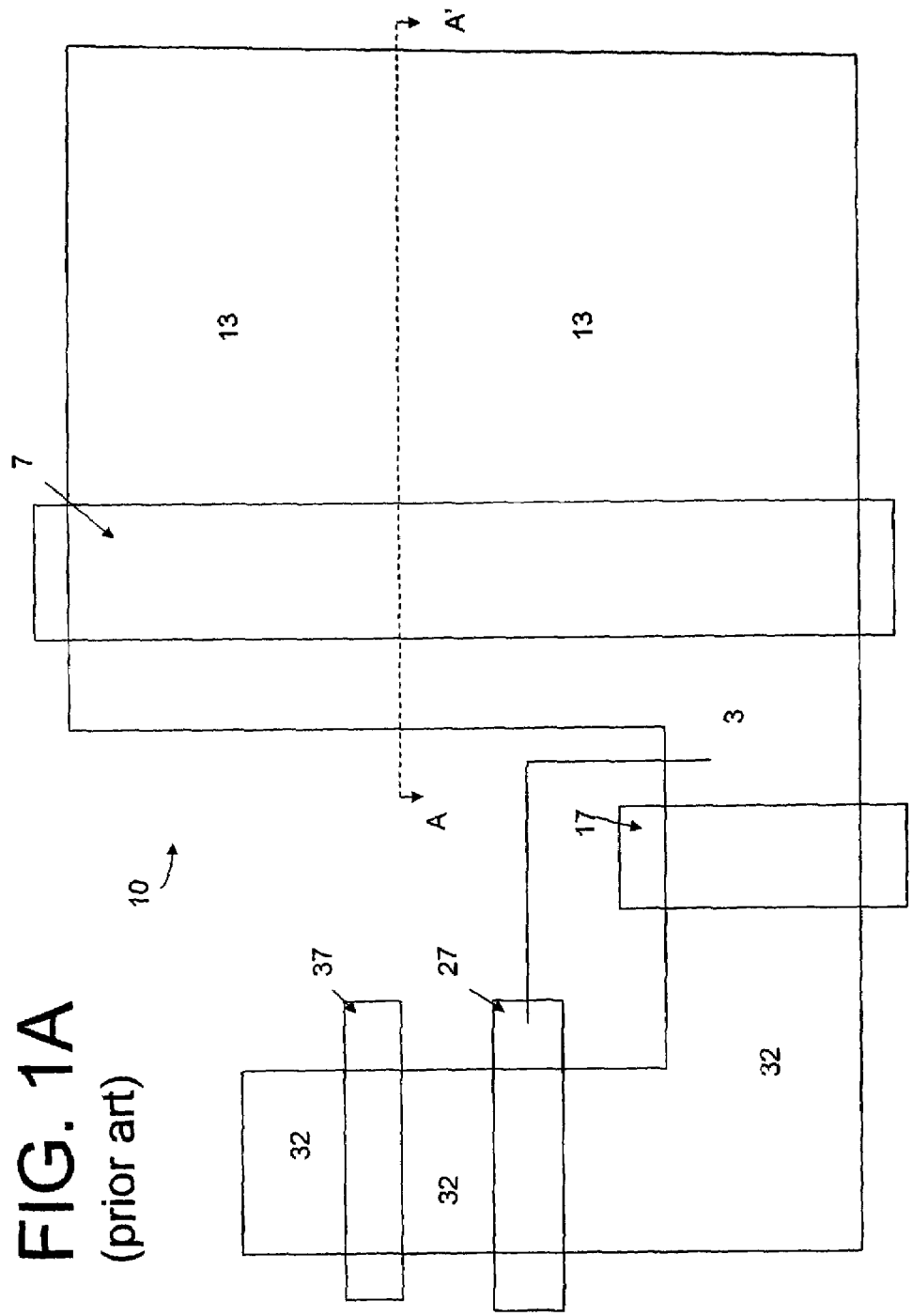
FIG. 1A is a top-down view of a conventional four-transistor (4T) pixel cell.
Figure 1B:
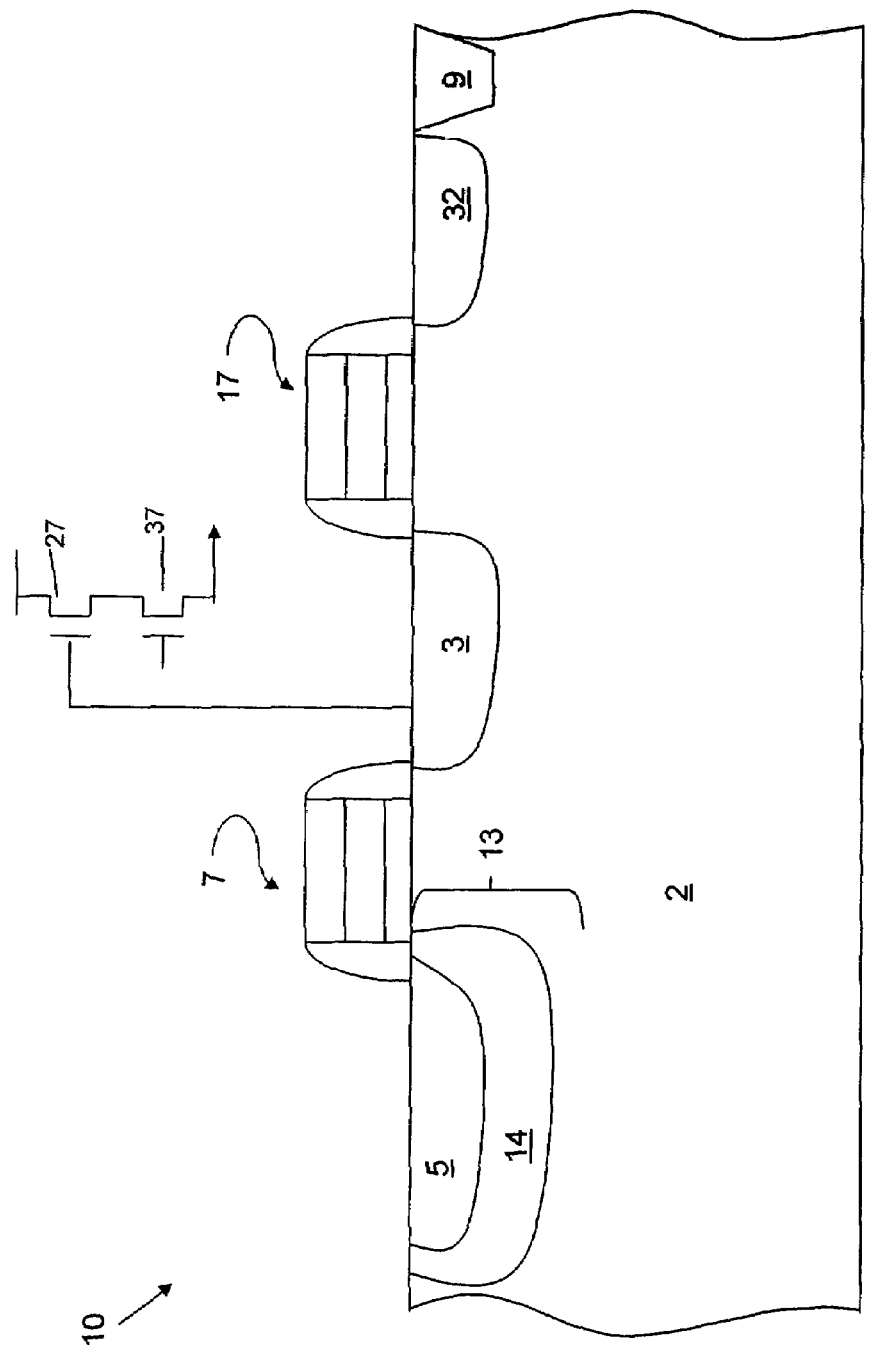
FIG. 1B is a cross-sectional view of the conventional four-transistor pixel cell of FIG. 1A, taken along line A-A'.

A readout of the charges accumulated in the accumulation region 102 is desired, as the charges correspond to the amount of incident light applied to the pixel cell 100. An exemplary readout operation for pixel cell 100 begins by having a predetermined voltage (e.g., $V_{gnd}$) applied at the first terminal contact 105. A readout of the current is taken from the terminal contact 106 at the other side of the channel region 104 representing a measurement of the charges collected in the accumulation region 102. In this way, the JFET structure is operating like a source follower transistor 27 (FIG. 1A) for a conventional pixel cell 10. The current flowing through the second terminal contact 106 is selectively read out through the row select transistor 110 when activated, and is converted to $V_{sig}$ by readout circuitry (FIG. 4). The readout of pixel cell 100, as just described, is advantageously a non-destructive readout because the charges are not transferred out of the accumulation region 102 through a transfer transistor 7 (FIGS. 1A and 1B) as they are in a conventional 4 T pixel cell 10. This allows multiple readouts if desired. In addition, this non-destructive readout allows the pixel cell 100 to be used in an automatic light control (ALC) circuit which continuously reads the incident light. As such, the row select transistor 110 remains on to allow a continuous pixel output signal $V_{sig}$ to be applied to column line 60 (FIG. 2A). It should also be noted that although FIG. 2B shows a voltage applied to a first contact 105 and the row select transistor 110 connected to a second contact 106, these can be reversed.

Other than the terminal contacts 105, 106 and reset gate 112, the pixel cell 100 has no other structures over the photosensitive areas of the substrate that could block incoming light, such as a transfer gatestack. Thus, unlike the convention pixel cell 10 (FIG. 1A), which has a fill factor of approximately fifty percent, the pixel cell 100 has an increased fill factor.

In order to reset the pixel 100, the reset transistor 112 gate is activated which turns the reset transistor 112 on to couple the charge accumulation region 102 to the voltage supply $V_{aa\text{-}pix}$ connected to drain region 111. Thus, a pixel reset output signal, $V_{rst}$ can be read through an activated row select transistor 110 after region 102 is reset. When charges accumulate in region 102, the row select transistor 110 may be on to supply a continuous pixel output signal $V_{sig}$ sampling at the end of an integration period. Alternatively, the row select transistor 110 may be turned on at the end of the integration period to produce $V_{sig}$ output signal for sampling.

Referring to FIGS. 3 and 4, the operation of exemplary pixel cell 100 as incorporated into an imager device 308 (FIG. 4) is now described. In operation, the reset transistor 112 resets the charges in the accumulation region 102 by dumping the charges into the reset drain region 111, which is connected to a supply voltage. During the reset operation, the reset transistor 112 is turned on by control circuitry 250 (FIG. 4) to allow charges in the accumulation region 102 to be drained into the drain region 111 (Step 201). Similar to the charge readout discussed above, a readout of the reset condition ($V_{rst}$) occurs next with sample and hold circuit 261. Specifically, row select transistor 110 is turned on, and the charge current traveling through the channel region 104 is read out through the second terminal contact 106. As approximately no charge is in the accumulation region 102 during this reset condition, the readout, at step 202, should reflect an initial (or unaffected) voltage. An associated sample and hold step 203 is performed by sample and hold circuitry 261 (FIG. 4). It should be noted that the accumulation region 102 may be fully depleted during the reset operation just described, thus minimizing any kTC noise in the pixel cell 100.

After charge collection region 102 is reset, an integration period begins during which accumulating charges in the accumulation region 102 affect the charge current flow in the channel region 104. Since constant charge monitoring can occur through these terminal contacts 105, 106 as described above as long as row select transistor 110 is on, automatic light control (ALC) operation may occur as the pixel output signal $V_{sig}$ is continuously output on column line 60. The ALC signal may be read out to determine an optimal time for readout of the entire pixel array. As shown, in step 204 of FIG. 3, during the ALC operational mode, if implemented, readout of pixel cell 100 output $V_{sig}$ is used as a signal $V_{ALC}$. The signal $V_{ALC}$ can be compared with a predetermined reference signal $V_{trigger}$ to produce an ALC control signal through comparator 251 when the $V_{ALC}$ signal reaches the trigger value. It should be understood that the readout of the signal $V_{ALC}$ represents the amount of charge accumulated in accumulation region 102 at a given point in time.

One use of the $V_{ALC}$ signal can be to stop the integration of an image when a pixel of an array is close to saturation. Thus, when at step 204 $V_{ALC}$ reaches the voltage $V_{trigger}$, the image processor 280 (FIG. 4) can be informed and can terminate the image integration period.

Whether an ALC operation is employed or not, at the end of an integration period, the row select transistor 110 is on and the pixel output signal $V_{sig}$ is applied to column line 60 (step 205) and is sampled and held by sample and hold circuit 261.

Other embodiments of a pixel cell 100 may be constructed in accordance with the invention. For example, although the exemplary pixels 100, 200 have been described as having a p-type substrate 101, n-type accumulation region 102, and p-type channel region 104, the invention is not limited to the described configuration. It should be understood that other configurations, including a pixel cell having a reversed dopant profile, are other embodiments that are within the scope of the present invention.

FIG. 4 shows an exemplary CMOS imaging integrated circuit 308 which includes a pixel array 240, with rows and columns of pixel cells. As shown in FIG. 4, each pixel of array 240 could be implemented like exemplary cell 100. The pixels of each row in array 240 are turned by a row select line, illustratively RS (FIG. 2A). All pixels in a row may be turned on at the same time for these operations. Signals from each column are provided on a respective column line and selectively output by column selector 260 in response to respective column select signals. The row select lines are selectively activated by a row driver 245 in response to a row address decoder 220. The column select lines are selectively activated by a column address decoder 270. Thus, a row and column address is provided for each pixel 100 in the array 240.

The pixel array 240 is operated by the timing and control circuit 250, which controls address decoders 220, 270 for selecting the appropriate row and column lines for pixel readout and sampling. The control circuit 250 also controls the row and column driver circuitry 245, 260 such that these apply driving voltages to the drive transistors of the selected row and column select lines. Control circuit 250 also controls sample and hold (S/H) circuit 261 to read and store pixel output signals from column selector 260. S/H circuit 261 receives pixel reset signal $V_{rst}$ and pixel image signal $V_{sig}$ and provides them to a differential amplifier 263. A differential signal ($V_{sig}$–$V_{rst}$) is produced by differential amplifier 263 for each pixel, and the differential signal is then digitized by the analog to digital converter 275 (ADC). The analog to digital converter 275 supplies the digitized pixel signals to an image processor 280 which forms and outputs a digital image.

Additional ALC circuitry may also include, in this embodiment, ALC circuitry 251 for reading the sample voltage, $V_{ALC}$, from a pixel's photo-conversion device. $V_{ALC}$ will be sampled either periodically or continuously until it approximates the predetermined reference trigger voltage $V_{trigger}$ at which point the ALC monitoring circuit 251 produces a signal used by image processor 280. The image processor then signals timing and control circuitry 250 to initiate a readout process, including readout of $V_{rst}$ and $V_{sig}$ from all of the pixel cells of array 240.

A value for $V_{trigger}$ may be selected as desired. For example, $V_{trigger}$ may be chosen such that readout will occur only when pixel cells of array 240 have accumulated sufficient charge to result in an image in which characteristics of the imaged subject matter are visible. Otherwise stated, $V_{trigger}$ may be chosen such that a resultant image will not be too dark.

This ALC circuitry 251 just described may be a part of the image sensor integrated circuit 308 or, alternatively, it may be separate from the image sensor integrated circuit 308. Without being limiting, for example, ALC circuitry may be included in the form of hardware or equivalent software in a processor, such as a CPU, which communicates with the image sensor integrated circuit 308.

FIG. 5 illustrates a processor-based system 1100 including an imaging device 308, which has pixels constructed in accordance with the methods described herein. For example, pixels may be any of the exemplary pixel cells 100 constructed in accordance with the exemplary embodiments of the invention described above. The processor-based system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 1100, for example a camera system, generally comprises a central processing unit (CPU) 1102, such as a microprocessor, that communicates with an input/output (I/O) device 1106 over a bus 1104. Imaging device 308 also communicates with the CPU 1102 over the bus 1104, and may include a CMOS pixel array having the exemplary pixels 100 as discussed above. The processor-based system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor. Any of the memory storage devices in the processor-based system 1100 could store software for employing the above-described method.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a pixel sensor comprising steps of:
    forming a photosensitive JFET having a gate region buried beneath a top surface of a substrate;
    forming a channel region located above the gate region; and
    forming circuitry electrically coupled to the channel region for reading out a signal representing the amount of charges generated by the photosensitive JFET.

2. The method of claim 1, wherein the step of forming circuitry comprises forming a first terminal at the surface of the substrate adjacent a first side of the channel region.

3. The method of claim 2, wherein the step of forming circuitry further comprises the step of:
    forming a second terminal at the surface of the substrate and located adjacent a second side of the channel region.

4. The method of claim 3, wherein the step of forming a first terminal comprises forming a layer of polysilicon.

5. The method of claim 1, wherein the channel region is a p-type region located in the substrate and the gate region is an n-type charge accumulation region that accumulates the amount of charges generated by the photosensitive JFET.

6. A method of forming a photosensor, comprising:
    forming a light striking region;
    forming a JFET gate region comprising an accumulation region for changing a resistance of a JFET channel region by accumulating charges generated in response to light received by the light striking region; and
    forming the JFET channel region above the JFET gate region.

7. The method of claim 6, wherein the accumulation region is doped to a first conductivity type and the JFET channel region is doped to a second conductivity type.

8. The method of claim 6, wherein an increase in the charges accumulated by the accumulation region causes an increase in conductivity of the JFET channel region.

9. The method of claim 8, wherein the JFET channel region and the JFET gate region are buried beneath a substrate surface of the photosensor.

10. A method of forming a pixel sensor cell, comprising:
    forming a photosensitive element for generating charges in response to applied light;
    forming a JFET gate region comprising an accumulation region for accumulating an amount of charges generated by the photosensitive element; and
    forming a JFET channel region above the JFET gate region, the JFET channel region having a changeable resistance dependent upon the amount of charges in the accumulation region.

11. The method of claim 10, further comprising:
    forming a circuit for producing a signal based on the resistance of the channel region.

12. The method of claim 11, wherein the JFET channel region is formed beneath a top surface of the substrate and above the charge accumulation region.

13. The method of claim 10, wherein an increase in the amount of charges accumulated by the accumulation region causes an increase in conductivity of the JFET channel region.

14. The method of claim 10, wherein the amount charges generated by the photosensitive element can be determined by the resistance of the JFET channel region.

15. The method of claim 10, further comprising:

forming a first contact for applying a voltage to the JFET channel region; and forming a second contact for outputting a signal corresponding to the resistance of the JFET channel region when the first contact applies the voltage.

16. The method of claim 15, further comprising:

forming a row select transistor electrically connected to the second contact.

17. The method of claim 15, further comprising:

forming a drain for releasing the amount of charges accumulated by the accumulation region to start a reset period.

18. The method of claim 17, further comprising:

forming sample and hold circuitry for receiving a signal based on the resistance of the JFET channel region during the reset period.

19. A method of forming a pixel sensor cell, comprising:

forming a photosensitive element at least partially in a substrate, the photosensitive element for generating an amount of charges in response to applied light;

forming a JFET channel region located beneath the top surface of the substrate;

forming a JFET gate region beneath a top surface of the substrate and under the JFET channel region, the JFET gate region including a charge accumulation region adapted to vary a resistance characteristic of the JFET channel region by accumulating the amount of charges generated by the photosensitive element;

forming a first contact electrically connected to the JFET channel region and for reading out a signal representing a current flowing through the channel region; and forming a transistor for draining the accumulated charges from the charge accumulation region to a drain region.

20. A method of forming an array of pixel sensor cells, comprising:

forming a plurality of pixel sensor cells in a substrate;

forming a JFET gate region comprising an accumulation region in at least one pixel cell, the accumulation region for accumulating an amount of charges generated by a photosensor of the at least one pixel cell and located beneath a top surface of the substrate; and forming a JFET channel region in the at least one pixel cell, the JFET channel region located above the JFET gate region and having a resistance adapted to change in response to the amount of charges accumulated in the accumulation region.

21. The array of pixel sensor cells of claim 20, wherein the at least one pixel cell further comprises a first terminal contact applying a voltage to the JFET channel region and a second terminal contact performing a read out in response to the applied voltage.

22. The array of pixel sensor cells of claim 21, wherein the at least one pixel cell further comprises a first row select transistor selectively reading out signals from the second terminal contact.

* * * * *